(12) United States Patent
Ayai et al.

(10) Patent No.: US 6,844,064 B1
(45) Date of Patent: Jan. 18, 2005

(54) METHOD OF MANUFACTURING OXIDE SUPERCONDUCTING WIRE, OXIDE SUPERCONDUCTING WIRE, SUPERCONDUCTING COIL AND SUPERCONDUCTING APPARATUS

(75) Inventors: Naoki Ayai, Osaka (JP); Ryosuke Hata, Osaka (JP); Hiromi Takei, Osaka (JP); Kazuhiko Hayashi, Osaka (JP); Takeshi Hikata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/869,701
(22) PCT Filed: Nov. 1, 2000
(86) PCT No.: PCT/JP00/07711
§ 371 (c)(1),
(2), (4) Date: Jul. 3, 2001
(87) PCT Pub. No.: WO01/33580
PCT Pub. Date: May 10, 2001

(30) Foreign Application Priority Data

Nov. 4, 1999 (JP) ............................................ 11-314315

(51) Int. Cl.$^7$ ................................................ D02G 3/40
(52) U.S. Cl. ....................... 428/375; 428/369; 428/370; 428/373; 428/374; 428/397; 428/403
(58) Field of Search ................................. 428/369, 370, 428/373, 374, 375, 397, 403, 380, 385, 389, 930; 505/701, 704, 230; 257/662

(56) References Cited

U.S. PATENT DOCUMENTS 5,051,397 A * 9/1991 Sato et al. .................. 257/662
5,358,929 A * 10/1994 Fujikami et al. .......... 228/179.1
5,949,131 A * 9/1999 Sato et al. .................. 257/662

FOREIGN PATENT DOCUMENTS

| EP | 0 371 410 | 6/1990 |
| EP | 0 807 994 | 11/1997 |
| JP | 57-140706 | 9/1982 |
| JP | 59-16208 | 1/1984 |
| JP | 64-3082 | 1/1989 |
| JP | 4-160771 | 6/1992 |

* cited by examiner

Primary Examiner—Terrel Morris
Assistant Examiner—Andrew T. Piziali
(74) Attorney, Agent, or Firm—Foley & Lardner LLP

(57) ABSTRACT

A method of manufacturing an oxide superconducting wire which can manufacture the longest possible wire by connecting relatively short wires with each other and is capable of suppressing reduction of a critical current resulting from influence by strain when the wires connected with each other are bent, an oxide superconducting wire, a superconducting coil and a superconducting apparatus are provided. According to the method of manufacturing an oxide superconducting wire by superposing end portions of two oxide superconducting wires (1, 2) with each other thereby bonding the end portions and connecting the oxide superconducting wires with each other, a junction (L) formed by superposing the end portions with each other is so worked as to reduce the quantity of strain on an end of the junction (L) when the two oxide superconducting wires (1) and (2) connected with each other are bent. Each of the oxide superconducting wire, the superconducting coil and the superconducting apparatus has the aforementioned junction (L), and the quantity of strain on the end of the junction (L) is reduced in the aforementioned manner.

10 Claims, 6 Drawing Sheets

METHOD OF MANUFACTURING OXIDE SUPERCONDUCTING WIRE, OXIDE SUPERCONDUCTING WIRE, SUPERCONDUCTING COIL AND SUPERCONDUCTING APPARATUS

TECHNICAL FIELD

The present invention relates to a method of manufacturing an oxide superconducting wire, an oxide superconducting wire, a superconducting coil and a superconducting apparatus, and more particularly, it relates to superconducting apparatuses such as a superconducting transformer, a superconducting current limiter and a magnetic field generator employing superconducting magnets prepared from oxide superconducting wires, a superconducting cable and a superconducting bus bar employing oxide superconducting wires and the like and a method of manufacturing an oxide superconducting wire applicable for manufacturing these superconducting apparatuses.

BACKGROUND TECHNIQUE

In general, a sufficient length is required for an oxide superconducting wire employed in a practical superconducting apparatus. In order to manufacture a cable conductor having a capacity of at least 100 megawatts (MW) as a practical superconducting cable, for example, hundreds of oxide superconducting wires exhibiting a unit length of about 5 km as the final length of the superconducting cable are required. In this case, a wire (diameter: 0.9 mm, critical current: 20 A, temperature: 77 K) formed by bismuth oxide superconductor filaments coated with silver is employed as the oxide superconducting wire, for example.

As a superconducting magnet employed for a magnetic separator or a magnetic field generator, a magnet having an inner diameter exceeding 1 m is manufactured. In order to manufacture such a superconducting magnet, about 1000 oxide superconducting wires exhibiting a unit length of about 800 m per coil are required, for example. In this case, a tape-like wire (thickness: 0.25 mm, width: 4 mm, critical current: 50 A (temperature: 77 K)) formed by bismuth oxide superconductor filaments coated with silver is employed as the oxide superconducting wire.

At the current level of the technique of manufacturing an oxide superconducting wire, however, only a wire formed by bismuth oxide superconductor filaments coated with silver having a unit length of about several 100 m is manufactured. When the oxide superconducting wire of such a unit length has a single defective portion, the entire oxide superconducting wire of about several 100 m is regarded as defective, to disadvantageously result in a low manufacturing yield. Unless a technique of manufacturing an elongated oxide superconducting wire is developed, therefore, it is impossible at present to apply the current technique to the aforementioned practical superconducting apparatus. This is one of the primary factors for delay in the application of superconducting apparatus, which is an innovative technique, to industry and practical application thereof.

If a wire having a large unit length can be manufactured by connecting relatively short oxide superconducting wires with each other in order to implement the aforementioned superconducting cable having a capacity of at least 100 MW or a superconducting magnet employed for a magnetic field generator, it is possible to prepare a prototype apparatus for applying a superconducting apparatus to industry. Further, it is possible to understand the merits of the superconducting apparatus through the prepared prototype apparatus for progress in practical application.

However, the critical current of an oxide superconducting wire is disadvantageously reduced due to influence by strain resulting from deformation such as bending or tension. When end portions of oxide superconducting wires having a small unit length are superposed for connecting the oxide superconducting wires with each other by brazing or soldering, for example, the wires are bent through a guide roller or the like in the process of manufacturing a superconducting cable or a superconducting magnet and the critical current is reduced due to bending strain applied to the wires. This is because the junction formed by superposing the end portions with each other is hardly bent while the remaining portions are readily bent. Hence an end of the junction is bent with a bending radius smaller than the radius of the guide roller or the like when the end of the junction is bent through the guide roller or the like. As a result, a strain larger than an allowable bending strain for allowing the wires to maintain the critical current is applied to the end of the junction. Even if an oxide superconducting wire having a large unit length can be obtained by connecting the wires, therefore, the critical current is reduced due to influence by the strain applied to the end of the junction of the wire and hence it is disadvantageously difficult for a practical superconducting apparatus formed by the long wire to attain a prescribed function.

Accordingly, an object of the present invention is to provide a method of manufacturing an oxide superconducting wire which can manufacture the longest possible wire by connecting relatively short wires with each other and is capable of suppressing reduction of a critical current resulting from influence by strain also when the wire is bent after connection.

Another object of the present invention is to provide an oxide superconducting wire, a superconducting coil and a superconducting apparatus each comprising a connected portion, which can suppress reduction of an initial critical current of wires before connection also in a bent state.

DISCLOSURE OF THE INVENTION

A method of manufacturing an oxide superconducting wire according to an aspect of the present invention comprises a step of bonding end portions of two oxide superconducting wires by superposing the end portions with each other for connecting the oxide superconducting wires with each other and a step of working a junction formed by superposing the end portions with each other to reduce the quantity of strain on an end of the junction to be close to the quantity of strain on non-superposed portions of the oxide superconducting wires when the two oxide superconducting wires connected with each other are bent.

When the junction is worked in the aforementioned manner, reduction of a critical current caused by bending strain can be suppressed also when the wire is bent through a guide roller or the like after connection. Therefore, an oxide superconducting wire having a length necessary for various superconducting apparatuses can be prepared by connecting relatively short oxide superconducting wires. Also when such a long oxide superconducting wire is left in a state wound on a reel or the like, reduction of the critical current caused by applied strain is suppressed. Therefore, a long superconducting cable or a large superconducting magnet can be manufactured by continuously supplying the prepared long oxide superconducting wire while simultaneously performing insulating coating on the wire.

In the method of manufacturing an oxide superconducting wire according to the present invention, the step of bonding the aforementioned oxide superconducting wires is preferably carried out by superposing the end portions of the two oxide superconducting wires with each other with interposition of a brazing filler metal.

The oxide superconducting wires are preferably tape-like wires having rectangular cross sections.

The step of bonding the aforementioned oxide superconducting wires is preferably carried out by superposing wide surfaces of two tape-like wires with each other. The aforementioned step of working the aforementioned junction is preferably carried out by working the end portions so that the widths of the tape-like members are reduced toward the ends.

The step of working the aforementioned junction is preferably carried out by cutting the end portions to have V shapes in plane or by cutting the end portions so that the end portions have end surfaces inclined in the width direction across the widths of the tape-like wires.

The step of working the aforementioned junction is preferably carried out by working the end portions so that the thicknesses of the tape-like wires are reduced toward the ends.

The oxide superconducting wires may be round wires.

Further, the step of working the aforementioned junction is preferably carried out by at least partially coating the junction with a metal or an organic substance thereby reducing the aforementioned quantity of strain. In this case, the step of working the aforementioned junction is preferably carried out by at least partially inserting the junction into a material having an annular shape.

The oxide superconducting wire to which the manufacturing method according to the present invention is applied preferably contains a bismuth oxide superconductor. When the bismuth oxide superconductor is employed, the wire is preferably formed by bismuth oxide superconductor filaments coated with a material containing silver.

An oxide superconducting wire according to another aspect of the present invention comprises a first oxide superconducting wire having an end portion, a second oxide superconducting wire having an end portion and a junction formed by superposing the end portions of the first and second oxide superconducting wires with each other, and the quantity of strain on an end of the junction is reduced to be close to the quantity of strain on non-superposed portions of the first and second oxide superconducting wires.

When the oxide superconducting wire having the aforementioned structure is employed, reduction of initial critical currents of the wires before connection can be suppressed also when the wires are bent through a guide roller or the like in the process of manufacturing a superconducting cable or a superconducting magnet. Therefore, reduction of a yield can be suppressed when manufacturing a final superconducting cable or superconducting magnet by employing the oxide superconducting wire according to the present invention, while a long superconducting cable or a large superconducting magnet can be manufactured with high productivity.

In the oxide superconducting wire according to the present invention, the junction preferably includes a brazing filler metal interposed between the superposed end portions of the first and second oxide superconducting wires.

The oxide superconducting wires are preferably tape-like wires having rectangular cross sections.

The junction preferably includes a junction formed by superposing wide surfaces of two tape-like wires. The junction preferably includes an end portion so worked that the widths of the tape-like wires are reduced toward the end.

Further, the junction preferably includes an end portion having a V shape in plane or an end portion having an end surface inclined in the width direction across the widths of the tape-like wires.

The junction preferably includes an end portion so worked that the thicknesses of the tape-like wires are reduced toward the end.

The oxide superconducting wires may be round wires.

Further, the junction is preferably at least partially coated with a metal or an organic substance. In this case, the junction is preferably at least partially inserted into a material having an annular shape.

The oxide superconducting wires preferably contain a bismuth oxide superconductor. The bismuth oxide superconductor is preferably a filament coated with a material containing silver.

A superconducting coil according to still another aspect of the present invention comprises a first oxide superconducting wire having an end portion, a second oxide superconducting wire having an end portion and a junction formed by superposing the end portions of the first and second oxide superconducting wires with each other, and the quantity of strain on an end of the junction is reduced to be dose to the quantity of strain on non-superposed portions of the first and second oxide superconducting wires.

A superconducting apparatus according to a further aspect of the present invention comprises a first oxide superconducting wire having an end portion, a second oxide superconducting wire having an end portion and a junction formed by superposing the end portions of the first and second oxide superconducting wires with each other, and the quantity of strain on an end of the junction is reduced to be close to the quantity of strain on non-superposed portions of the first and second oxide superconducting wires.

According to the present invention, as hereinabove described, the longest possible wire can be manufactured by connecting short wires while reduction of a critical current resulting from influence by bending strain can be effectively suppressed by working the junction to reduce the quantity of strain on the end of the junction when the connected oxide superconducting wires are bent. Therefore, a long oxide superconducting wire used for a long superconducting cable or a large superconducting magnet can be previously prepared in a state suppressing reduction of the critical current. Thus, the oxide superconducting wire can be manufactured with high productivity without reducing a manufacturing yield. Consequently, the oxide superconducting wire or the superconducting coil according to the present invention can be applied to various superconducting apparatuses for readily progressing practical application.

BEST MODES FOR CARRYING OUT THE INVENTION

The following various embodiments can be listed as the method or the mode of connecting oxide superconducting wires according to the present invention. The respective embodiments are now described with reference to drawings.

FIGS. 1, 4 and 6 to 12 are longitudinal sectional views schematically showing various embodiments of the method or the mode of connecting oxide superconducting wires according to the present invention. FIGS. 2, 3, 5 and 13 are plan views schematically showing various embodiments of the method or the mode of connecting oxide superconducting wires according to the present invention.

Figure 1:
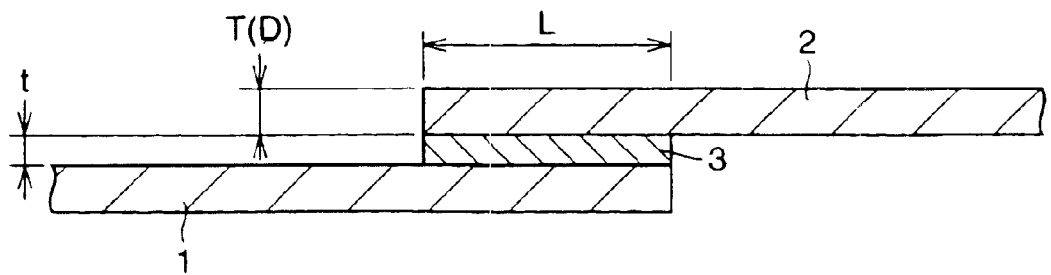
FIG. 1 is a longitudinal sectional view schematically showing an embodiment (1) of a method or a mode of connecting oxide superconducting wires according to the present invention.

(1) As shown in FIG. 1, end portions of tape-like or round bismuth oxide superconducting wires 1 and 2 are superposed and bonded with each other. A brazing filler metal 3 consisting of a material such as lead-tin alloy solder containing silver is arranged between the end portions of the oxide superconducting wires 1 and 2. Thus, the two oxide superconducting wires 1 and 2 are connected with each other. According to this embodiment, the length of a junction L is set to at least one time and not more than 100 times the diameter or the width of the oxide superconducting wires 1 and 2. Thus, the quantity of strain on an end of the junction can be reduced to be close to the quantity of strain on non-superposed portions of the wires when the wires connected with each other are bent.

(2) In the connection mode shown in FIG. 1, wide surfaces of the oxide superconducting wires 1 and 2 having rectangular cross sections are superposed to be bonded with each other. Thus, the quantity of strain on an end of the junction is reduced when the wires connected with each other are bent.

(3) In the connection mode shown in FIG. 1, the thickness t of the brazing filler metal 3 is set to be at least 0.01 times and not more than one time the diameter D or the thickness T of the oxide superconducting wires 1 and 2. Thus, the quantity of strain on an end of the junction can be reduced when the wires connected with each other are bent.

(4) In the connection mode shown in FIG. 1, the ribbon-like brazing filler metal 3 is held between the end portions of the oxide superconducting wires 1 and 2 having rectangular cross sections and heated thereby bonding the oxide superconducting wires 1 and 2 to each other.

(5) End portions of round oxide superconducting wires 1 and 2 are twisted and superposed, and bonded with each other with interposition of a brazing filler metal 3 therebetween.

(6) The oxide superconducting wires 1 and 2 are bonded to each other so that the pitch of the aforementioned twisting is at least one time and not more than 10 times the diameter of the wires 1 and 2.

Figure 2:
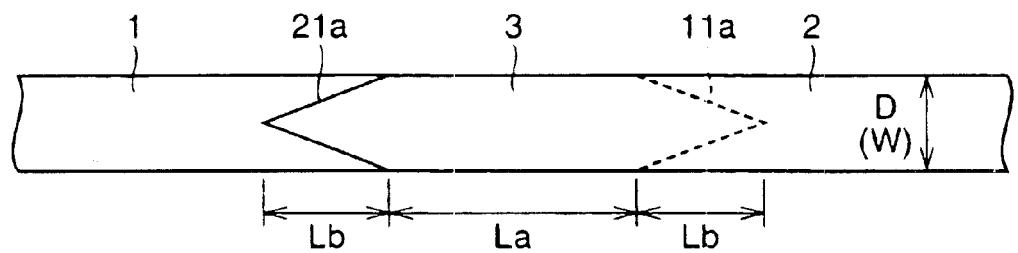
FIG. 2 is a longitudinal sectional view schematically showing an embodiment (7) of the method or the mode of connecting oxide superconducting wires according to the present invention.
Figure 3:
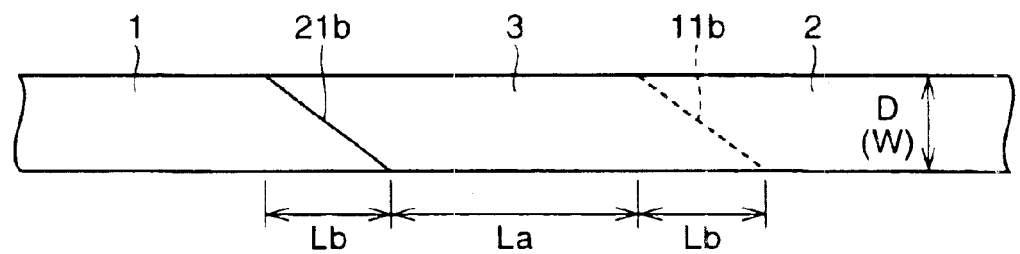
FIG. 3 is a longitudinal sectional view schematically showing an embodiment (7) of the method or the mode of connecting oxide superconducting wires according to the present invention.

(7) As shown in FIG. 2 or 3, an end portion 11a or 11b of an oxide superconducting wire 1 is so worked that the diameter D (in the case of a round wire) or the width W (in the case of a tape-like wire) is reduced toward the end in a plane shape. An end portion 21a or 21b of another oxide superconducting wire 2 is also worked similarly to the above. Thus, the quantity of strain on an end of a junction can be reduced when the wires connected with each other are bent.

In the connection mode shown in FIG. 2, the ends of the wires are so cut that the end portions 11a and 21a have V shapes in the case of the tape-like wire. In the connection mode shown in FIG. 3, the ends of the wires are so cut that the end portions 11b and 21b have end surfaces inclined in the width direction across the widths of the tape-like wires in the case of the tape-like wires.

Figure 4:
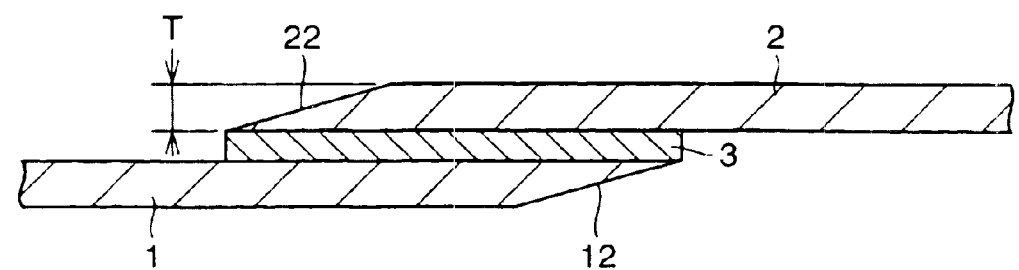
FIG. 4 is a longitudinal sectional view schematically showing an embodiment (8) of the method or the mode of connecting oxide superconducting wires according to the present invention.

(8) As shown in FIG. 4, an end portion 12 of an oxide superconducting wire 1 and an end portion 22 of another oxide superconducting wire 2 are so worked that the thickness T of the wires is reduced toward the ends. Thus, the quantity of strain on an end of a junction can be reduced when the wires connected with each other are bent.

Figure 5:
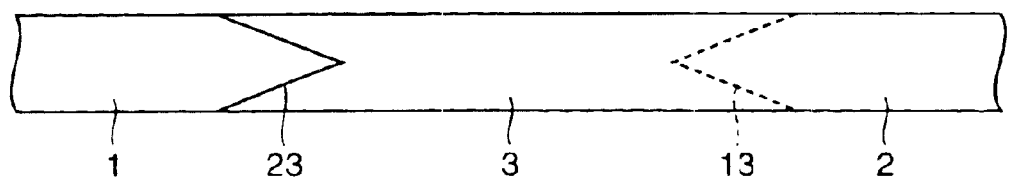
FIG. 5 is a longitudinal sectional view schematically showing an embodiment (9) of the method or the mode of connecting oxide superconducting wires according to the present invention.

(9) As shown in FIG. 5, notches are formed on an end portion 13 of an oxide superconducting wire 1 and an end portion 23 of another oxide superconducting wire 2. The diameter (in the case of round wires) or the width (in the case of tape-like wires) of the notches is increased toward the ends. Thus, the quantity of strain on an end of a junction is reduced when the wires connected with each other are bent.

Figure 6:
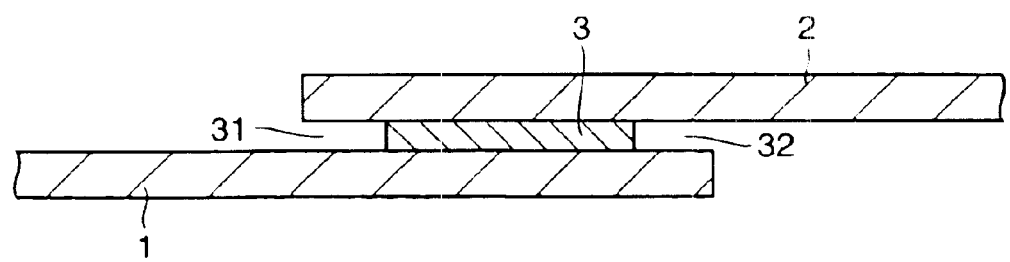
FIG. 6 is a longitudinal sectional view schematically showing an embodiment (10) of the method or the mode of connecting oxide superconducting wires according to the present invention.

(10) As shown in FIG. 6, a brazing filler metal 3 is arranged partially along superposed end portions of oxide superconducting wires 1 and 2 while defining spaces 31 and 32. When a junction is bent in the mode shown in FIG. 6, the end portion of one of the wires pushes back the surface of the other wire in each of the spaces 31 and 32 thereby relaxing concentration of strain. Thus, the quantity of strain on an end of the junction is reduced when the wires connected with each other are bent.

Figure 7:
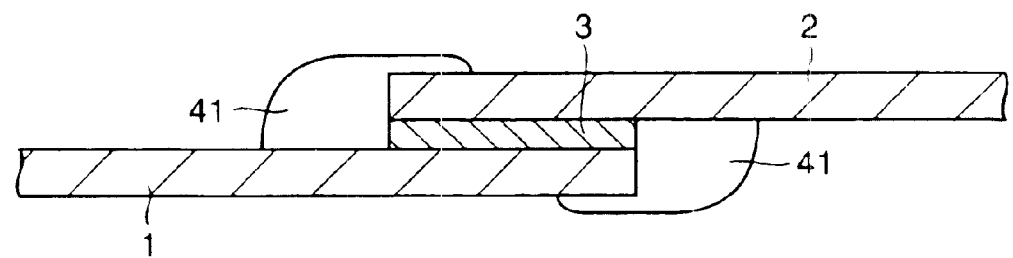
FIG. 7 is a longitudinal sectional view schematically showing an embodiment (11) of the method or the mode of connecting oxide superconducting wires according to the present invention.

(11) As shown in FIG. 7, a junction between ends of oxide superconducting wires 1 and 2 is partially coated with flexible materials 41.

Figure 8:
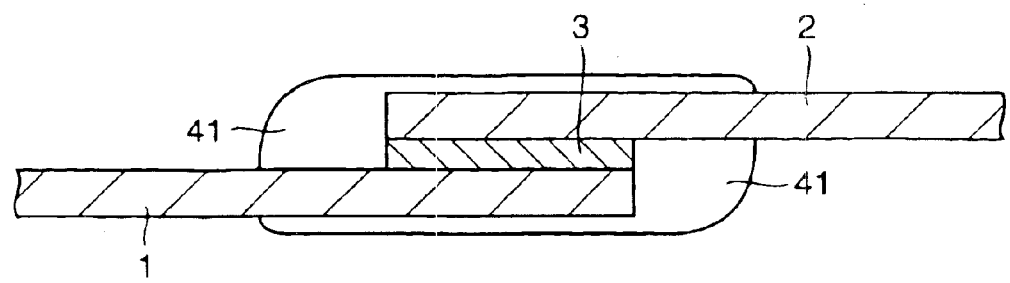
FIG. 8 is a longitudinal sectional view schematically showing an embodiment (12) of the method or the mode of connecting oxide superconducting wires according to the present invention.

(12) As shown in FIG. 8, a junction between ends of oxide superconducting wires 1 and 2 is entirely coated with flexible materials 41.

Thus, the quantity of strain on an end of the junction can be reduced when the wires connected with each other are bent.

Figure 9:
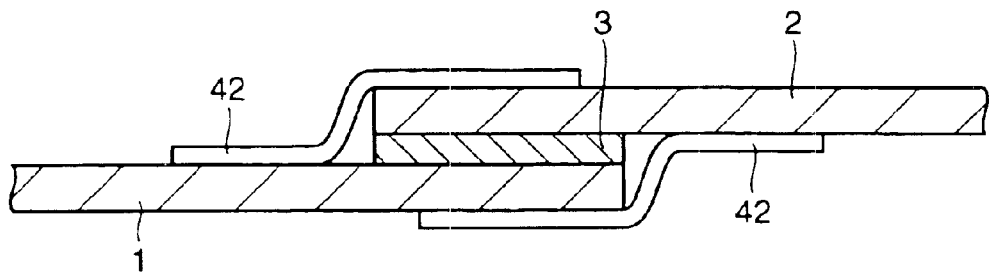
FIG. 9 is a longitudinal sectional view schematically showing an embodiment (13) of the method or the mode of connecting oxide superconducting wires according to the present invention.

(13) As shown in FIG. 9, a junction between oxide superconducting wires 1 and 2 is partially or entirely coated with tape-like materials 42 consisting of polyimide, copper, silver or the like.

(14) In the connection mode shown in FIG. 7 or 8, materials 41 of polyvinyl formal (PVF) resin or epoxy resin are employed. In this case, the aforementioned organic substance is partially or entirely applied to the junction and dried thereby partially or entirely coating the junction.

(15) In the connection mode shown in FIG. 9, metal tapes are employed as the materials 42 and the metal tapes are entirely or partially brazed to the junction thereby forming coatings.

(16) In the connection mode shown in FIG. 7 or 8, brazing filler metals are employed as the materials 41 and partially or entirely brazed to the junction thereby forming coatings. In this case, it is preferable to employ solder consisting of a lead-tin alloy containing silver having a high melting point as the material for the brazing filler metal 3, and to employ indium-based solder having a low melting point as the materials 41 forming the coatings. Thus, the junction can be coated with the materials 41 consisting of solder having a relatively low melting point after bonding the wires 1 and 2 with each other through the brazing filler metal 3.

Figure 10:
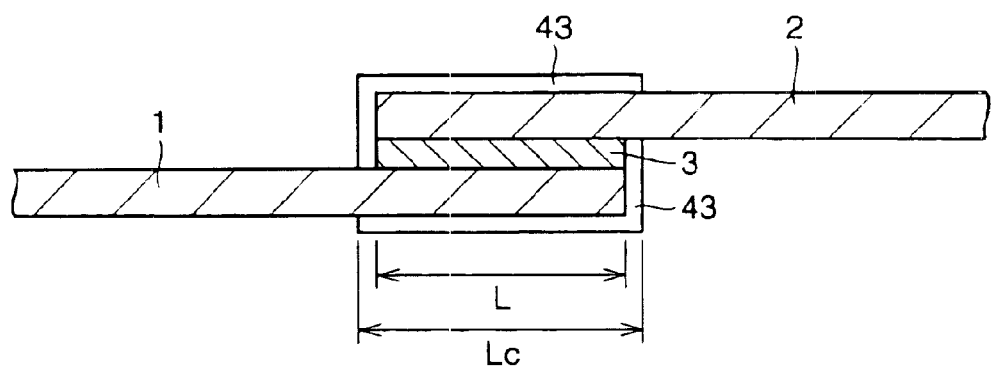
FIG. 10 is a longitudinal sectional view schematically showing an embodiment (17) of the method or the mode of connecting oxide superconducting wires according to the present invention.

(17) As shown in FIG. 10, a junction between oxide superconducting wires 1 and 2 is inserted into a material 43 having an annular shape to be entirely coated, and subjected to shrinkage fitting thereby forming a coating. Alternatively, a material 43 consisting of an organic substance having an annular shape coating the junction in place of a metal may be employed and shrunk by heating thereby forming a coating. A heat-shrinkable tube may be employed as the material 43 having an annular shape.

Figure 11:
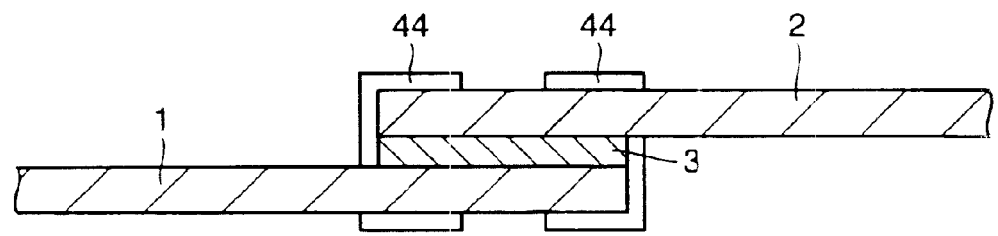
FIG. 11 is a longitudinal sectional view schematically showing an embodiment (18) of the method or the mode of connecting oxide superconducting wires according to the present invention.

(18) As shown in FIG. 11, a junction may be partially inserted into materials 44 consisting of a metal or an organic substance having annular shapes to be partially coated, and subjected to shrinkage fitting or heat-shrinking to be formed with coatings.

When the junction is partially or entirely coated as described above, the quantity of strain on an end of the junction can be reduced when the wires connected with each other are bent.

(19) In each of the connection modes described in the above items (11) to (18), the junction may be first partially or entirely coated with a material consisting of a metal, so that a material consisting of an organic substance is thereafter arranged thereon for forming a coating.

Figure 12:
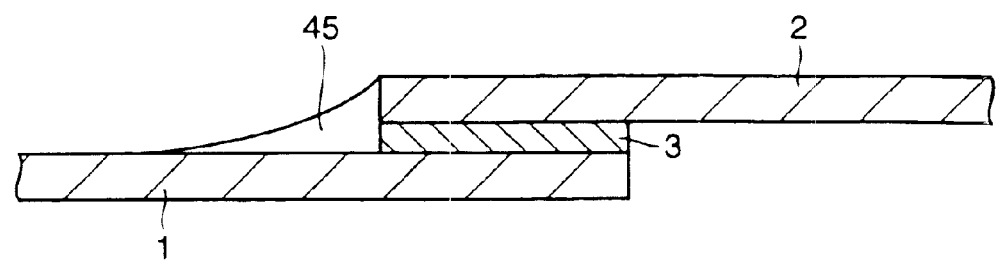
FIG. 12 is a longitudinal sectional view schematically showing an embodiment (20) of the method or the mode of connecting oxide superconducting wires according to the present invention.

(20) As shown in FIG. 12, an end of a wire is coated with a material 45 consisting of a metal or an organic substance in a junction between oxide superconducting wires 1 and 2. In this case, the thickness of the material 45 forming a coating is set to be reduced as separated from the junction. Thus, the quantity of strain on an end of the junction can be reduced when the wires connected with each other are bent.

Figure 13:
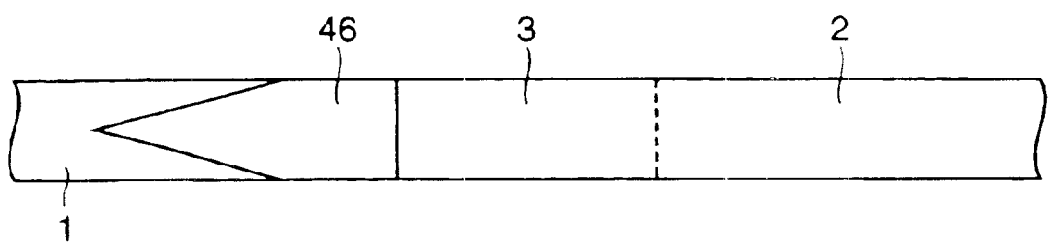
FIG. 13 is a longitudinal sectional view schematically showing an embodiment (21) of the method or the mode of connecting oxide superconducting wires according to the present invention.

(21) As shown in FIG. 13, the width of a material 46 consisting of a metal or an organic substance coating an end of a wire on a junction between oxide superconducting wires 1 and 2 is set to be narrowed as separated from the junction. Also in this case, the quantity of strain on an end of the junction can be reduced when the wires connected with each other are bent.

EXAMPLE 1

Three connectional wires were prepared by connecting bismuth-based (Bi(Pb)—Sr—Ca—Cu—O-based) oxide superconducting wires with solder consisting of a lead-tin alloy containing silver. Each wire was prepared from a tape-like wire obtained by coating 61 bismuth-based oxide superconductor filaments with a silver alloy sheath containing 0.3 percent by weight of manganese. The tape-like wire was 0.24 mm in thickness, 3.8 mm in width and 300 mm in length. The length L (see FIG. 1) of a junction between such wires was 100 mm. A voltage defined as 1 $\mu$V/cm was applied to each of the three connectional wires with an inter-terminal distance of 200 mm including the junction for measuring a critical current Ic, which was 55 A in each connectional wire.

The three connectional wires were worked as follows:
(a) Connectional Wire a Not worked but left in the connection mode shown in FIG. 1.
(b) Connectional Wire b
Coatings 41 were formed by applying polyvinyl formal (PVF) resin to entirely coat the junction of the connectional wire and drying the same as shown in FIG. 7.
(c) Connectional Wire c
Polyimide tapes 42 were bonded to coat the junction as shown in FIG. 9.

Figure 14:
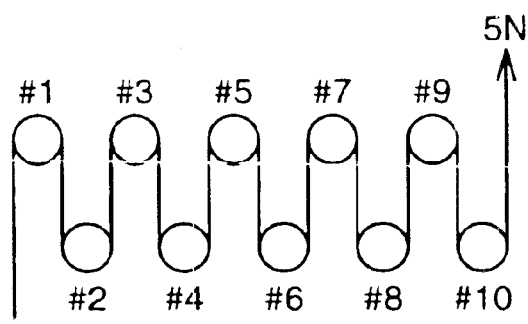
FIG. 14 is a diagram conceptually showing an apparatus for performing a bending strain test of connectional wires in Examples 1 and 2.

A test of applying bending strain to each of the aforementioned connectional wires a, b and c was executed. The bending strain test was performed by alternately bringing a surface and an opposite surface of the connectional wire into contact with outer peripheral areas of guide rollers (pulleys) of 180 mm in outer diameter over a central angle of about 180° and moving the same by five turns respectively in a state longitudinally applying tension 5N to the connectional wire, as shown in FIG. 14. Thus, the bending strain test was performed on the assumption of conditions close to those of an actual winding step passed through a number of pulleys, in order to verify mechanical strength of the connected portion. After the bending strain test, the critical current Ic was measured as to each of the connectional wires a, b and a. Consequently, the connectional wire a exhibited a value 30 A lower than an initial critical current 55 A while the connectional wire b and the connectional wire c exhibited high critical currents 48 A and 50 A respectively, and such results were obtained that the critical currents can be maintained at high ratios with respect to initial critical currents.

EXAMPLE 2

Four connectional wires were prepared by connecting bismuth-based (Bi(Pb)—Sr—Ca—Cu—O-based) oxide superconducting wires with solder consisting of a lead-tin alloy containing silver. Each wire was prepared from a tape-like wire obtained by coating 61 bismuth-based oxide superconductor filaments with a silver alloy sheath containing 0.3 percent by weight of manganese. Wide surfaces of such tape-like wires were superposed to be bonded with each other. The tape-like wire was 0.24 mm in thickness, 3.8 mm in width and 300 mm in length. The length L (see FIG. 1) of a junction between such wires was 50 mm. Voltage application terminals were mounted about the junction at an inter-terminal distance of 100 mm for applying a voltage defined as 1 $\mu$V/cm to each of the four connectional wires from these voltage application terminals and measuring a critical current IcO (initial critical current), which was 60 A in each connectional wire.

These four connectional wires were worked as follows:

(d) Connectional Wire d

Ends of two tape-like wires were cut (V-cut) into V shapes as shown in FIG. 2 and wide surfaces of the tape-like wires were superposed and bonded with each other, while lengths La and Lb were set to 40 mm and 5 mm respectively.

(e) Connectional Wire e

Ends of two tape-like wires were cut (N-cut) so that the ends had end surfaces inclined along the width direction across the widths of the tape-like wires as shown in FIG. 3 and wide surfaces of the tape-like wires were superposed and bonded with each other, while lengths La and Lb were set to 40 mm and 5 mm respectively.

(f) Connectional Wire f

Wide surfaces of two tape-like wires were superposed and bonded with each other without cutting ends of the tape-like wires as shown in FIG. 10, thereafter the junction (length L: 50 mm) was inserted into a heat-shrinkable tube having a length Lc of 60 mm and a thickness of 0.15 mm before shrinkage to be entirely coated, and the tube was shrunk by heating at about 100° C. for forming a coating. Electron-bridged soft flame-retarded polyolefin resin was employed as the material for the heat-shrinkable tube.

(g) Connectional Wire g

Not worked but left in the connection mode shown in FIG. 1.

A test of applying bending strain to each of the aforementioned connectional wires d, e, f and g was executed. The bending strain test was performed by alternately bringing a surface and an opposite surface of the connectional wire into contact with outer peripheral areas of guide rollers (pulleys) of 200 mm in outer diameter over a central angle of about 180° and moving the connectional wire to pass through the guide rollers in a state longitudinally applying tension 5N to the connectional wire, as shown in FIG. 14. Thus, the bending strain test was performed on the assumption of conditions close to those of an actual winding step passed through a number of pulleys, in order to verify mechanical strength of the connected portion. After the bending strain test, the critical current Ic was measured as to each of the connectional wires d, e, f and g.

Figure 15:
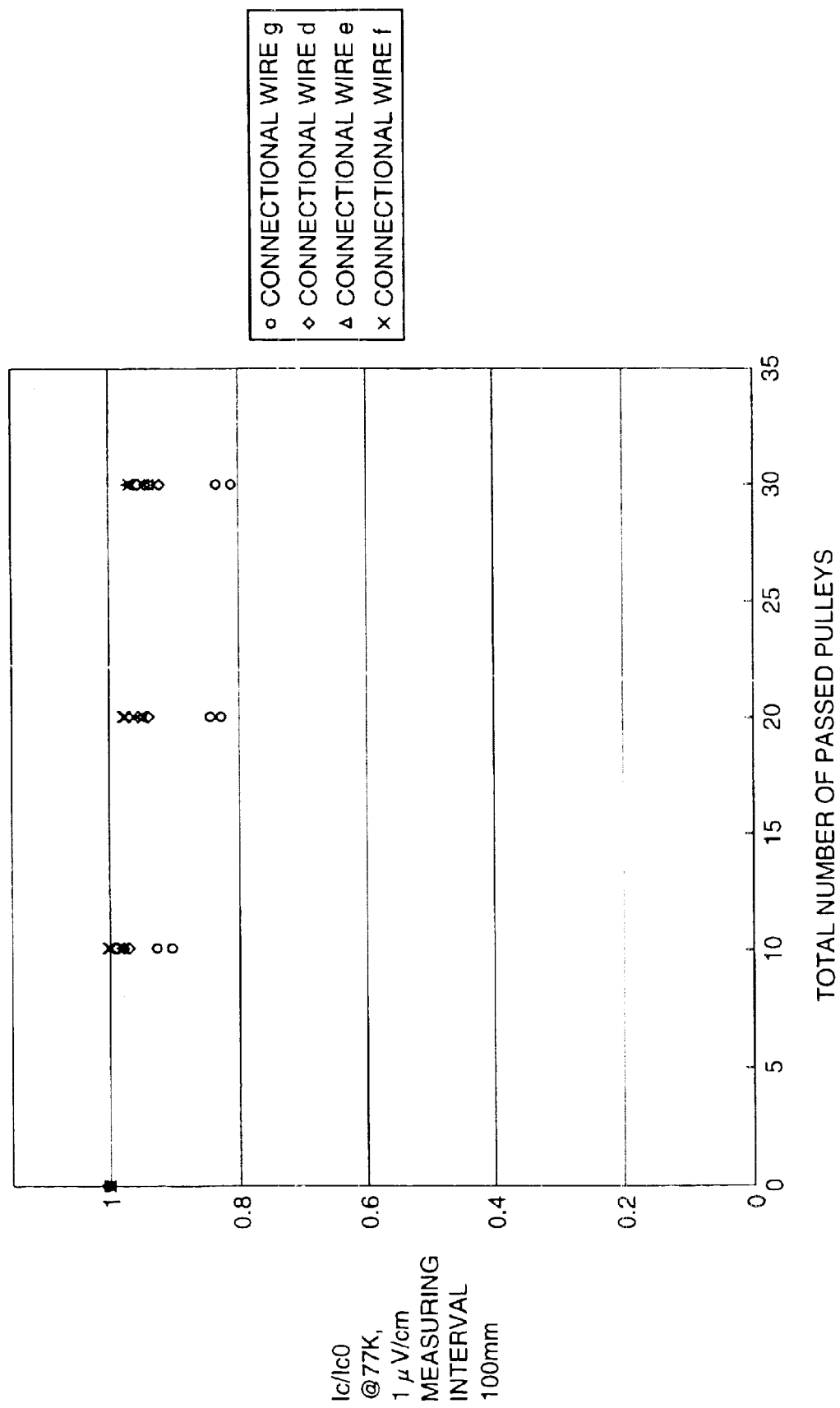
FIG. 15 illustrates the relation between the ratio Ic/IcO between a critical current Ic and an initial critical current IcO of each connectional wire after the bending strain test in Example 2 and the total number of pulleys passed by each connectional wire in the bending strain test.

FIG. 15 shows the relation between the ratio Ic/IcO of the critical current Ic to the initial critical current IcO of each connectional wire after the bending strain test and the total number of the pulleys passed by each connectional wire in the bending strain test. It is understood from FIG. 15 that the ratios of reduction of the critical currents Ic after the bending strain test were smaller in the connectional wires d, e and f having worked junctions as compared with the connectional wire g having a non-worked junction.

Figure 16:
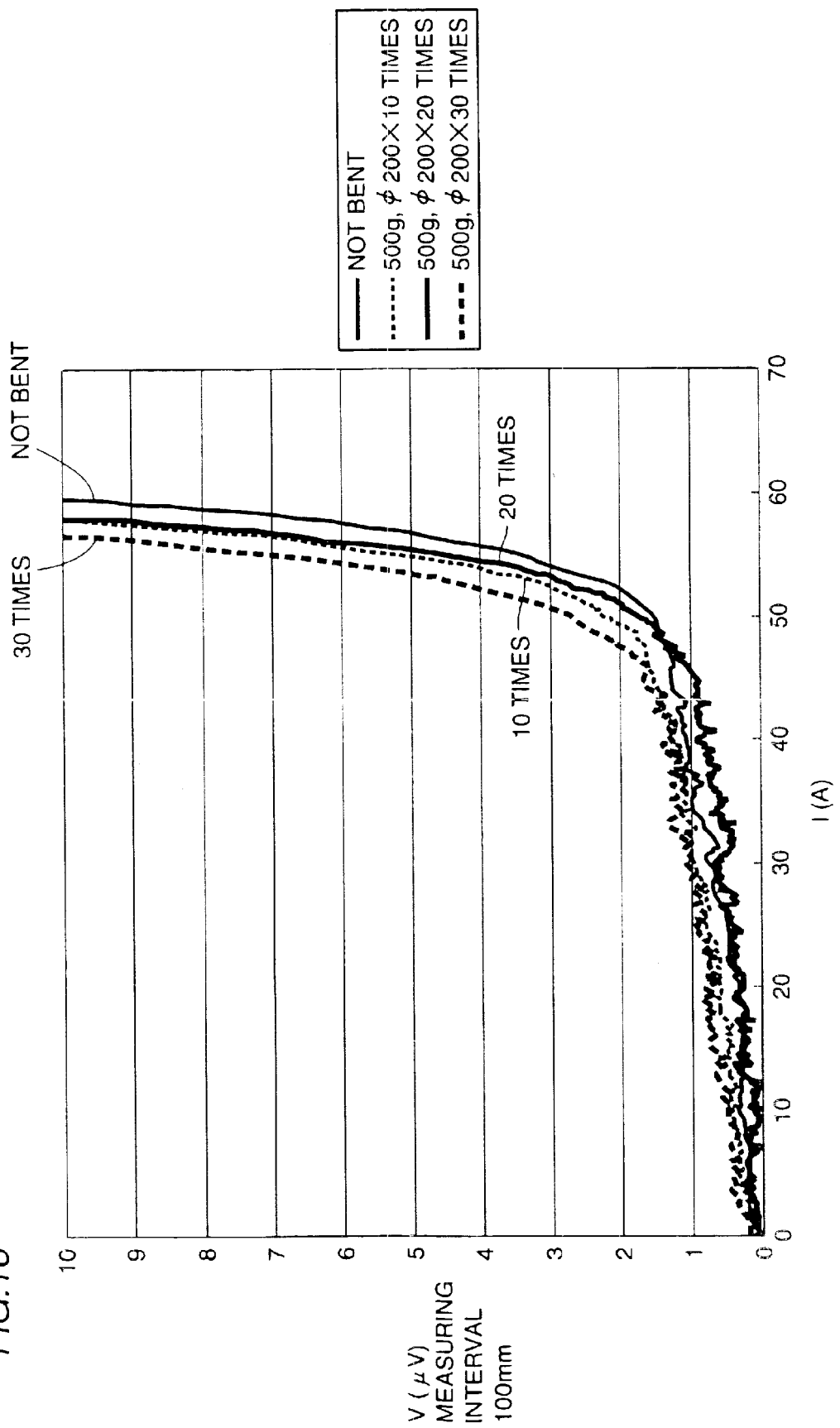
FIG. 16 illustrates current (I)-voltage (E) characteristics measured as to a connectional wire d in Example 2.

FIG. 16 shows current (I)-voltage (E) characteristics measured as to the connectional wire d. Referring to FIG. 16, a curve "not bent" shows data of the connectional wire d not subjected to bending strain, and curves "500 g, $\phi$200×10 times", "500 g, $\phi$200×20 times" and "500 g, $\phi$200×30 times" show data of the connectional wire d passed through the guide rollers of 200 mm in outer diameter 10 times, 20 times and 30 times respectively with application of a load of 500 g to be subjected to tensile bending strain. Referring to FIG. 16, inclination of the current-voltage characteristic curves with reference to a current I of 0 to 40 A shows connection resistance of the wire. It is understood from FIG. 16 that the inclination remains substantially unchanged in each curve and hence constant connection resistance was maintained also after application of the tensile bending strain and the connection resistance as well as the critical current Ic were hardly deteriorated. It is also understood that the connection resistance was about 20 n$\Omega$.

Embodiments and Examples disclosed above are illustratively shown in all points, and to be considered as not restrictive. The scope of the present invention is shown not by the aforementioned embodiments and Examples but by the scope of claim for patent, and to be interpreted as including all exemplary corrections and modifications within the meaning and range equivalent to the scope of claim for patent.

INDUSTRIAL APPLICABILITY

The oxide superconducting wire or the superconducting coil according to the present invention is suitably employed for superconducting apparatuses such as a superconducting transformer, a superconducting current limiter and a magnetic field generator employing superconducting magnets. Further, the oxide superconducting wire according to the present invention is suitably employed for superconducting apparatuses such as a superconducting cable and a superconducting bus bar. In addition, the method of manufacturing an oxide superconducting wire according to the present invention is applicable for manufacturing these superconducting apparatuses.

What is claimed is:

1. An oxide superconducting wire comprising:

a first oxide superconducting wire having a first end portion;

a second oxide superconducting wire having a second end portion; and said first oxide wire comprising at least a first superconducting filament surrounded by and in direct contact with a first sheath at least at said first end portion;

said second oxide wire comprising at least a second superconducting filament surrounded by and in direct contact with a second sheath at least at said second end portion;

said first oxide superconducting wire including a first outer surface defined by an outer surface of said first sheath and a first edge surface defined by an end of said first superconducting filament and an end of said first sheath;

said second oxide superconducting wire including a second outer surface defined by an outer surface of said second sheath and a second edge surface defined by an end of said second superconducting filament and an end of said second sheath;

said first outer surface forming a junction with said second outer surface by connecting said first outer surface to said second outer surface, in a region of said first and second end portions, by a brazing filler metal disposed therebetween; and said first edge surface being displaced from said second edge surface longitudinally along the direction of said first and second superconducting wires.

2. The oxide superconducting wire according to claim 1, wherein said oxide superconducting wires are tape-shaped wires having rectangular cross sections.

3. The oxide superconducting wire according to claim 2, wherein said junction includes a junction formed by superposing wide surfaces of two said tape-shaped wires.

4. The oxide superconducting wire according to claim 3, wherein at least one of said end portions is so worked that the width (W) of said at least one of said end portions is reduced toward the end.

5. The oxide superconducting wire according to claim 4, wherein said junction (L) includes an end portion having a V shape in plane.

6. The oxide superconducting wire according to claim 3, wherein at least one of said end portions is so worked that the thicknesses of said at least one of said end portions is reduced toward the distal end thereof.

7. The oxide superconducting wire according to claim 1, wherein said junction is at least partially coated with a metal or an organic substance.

8. The oxide superconducting wire according to claim 7, wherein said junction is at least partially inserted into a material having an annular shape.

9. The oxide superconducting wire according to claim 1, wherein said oxide superconducting wires contain a bismuth oxide superconductor.

10. The oxide superconducting wire according to claim 9, wherein said bismuth oxide superconductor is a filament coated with a material containing silver.

* * * * *